United States Patent
Lee et al.

(10) Patent No.: US 6,359,295 B2
(45) Date of Patent: *Mar. 19, 2002

(54) FERROELECTRIC MEMORY DEVICES INCLUDING PATTERNED CONDUCTIVE LAYERS

(75) Inventors: Mi-hyang Lee, Seoul; Dong-jin Jung, Kyungki-do, both of (KR)

(73) Assignee: Samsung Electronics Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/052,718

(22) Filed: Mar. 31, 1998

(30) Foreign Application Priority Data

Sep. 29, 1997 (KR) .............................. 97-49758

(51) Int. Cl.[7] .......................... H01L 29/76; H01L 29/94; H01L 31/062; H01L 31/113; H01L 31/119
(52) U.S. Cl. ........................ 257/295; 257/310; 438/240; 438/250; 438/393
(58) Field of Search ................................ 257/295, 310; 438/240, 250, 393

(56) References Cited

U.S. PATENT DOCUMENTS

| | | | |
|---|---|---|---|
| 5,046,043 A | 9/1991 | Miller et al. ................. | 365/145 |
| 5,122,923 A | 6/1992 | Matsubara et al. .......... | 361/321 |
| 5,185,689 A | * 2/1993 | Maniar ........................ | 361/313 |
| 5,216,572 A | * 6/1993 | Larson et al. ................ | 361/313 |
| 5,330,931 A | 7/1994 | Emesh et al. ................. | 437/60 |
| 5,468,684 A | 11/1995 | Yoshimori et al. .......... | 438/253 |
| 5,474,955 A | * 12/1995 | Thakur ........................ | 437/173 |
| 5,475,248 A | 12/1995 | Takenaka ..................... | 257/295 |

(List continued on next page.)

OTHER PUBLICATIONS

Notice to Submit Response, Korean App. No. 97–49758, Nov. 25, 1998.

*Primary Examiner*—Olik Chaudhuri
*Assistant Examiner*—Howard Weiss
(74) *Attorney, Agent, or Firm*—Myers Bigel Sibley & Sajovec (57) ABSTRACT

Integrated circuit ferroelectric memory devices are manufactured by forming a first patterned conductive layer on an integrated circuit substrate, to define a lower capacitor electrode and a gate electrode that is spaced apart therefrom. A source region and a drain region are formed on opposite sides of the gate electrode. A ferroelectric layer is formed on the lower capacitor electrode. An upper capacitor electrode is formed on the ferroelectric layer opposite the lower capacitor electrode, to thereby form a ferroelectric capacitor. After forming the upper capacitor electrode, an interconnect layer is formed that electrically connects the top electrode and the source region. A bit line is formed that electrically contacts the drain region. Preferably, both the interconnect layer and the bit line are formed from the same conductive layer. Integrated circuit ferroelectric memory devices include an integrated circuit substrate including an elongated active region therein, and a pair of spaced apart word lines that cross the elongated active region. A drain region is provided in the elongated active region between the pair of word lines. A pair of source regions is provided in the elongated active region, a respective one of which is outside the pair of spaced apart word lines on opposite sides of the drain region. A pair of ferroelectric capacitors are provided outside the elongated active region. A respective one of the ferroelectric capacitors is adjacent a respective one of the pair of source regions. An interconnect layer electrically connects a respective one of the upper capacitor electrodes to a respective one of the source regions and a bit line, electrically connected to the drain region and extending along the integrated circuit substrate orthogonal to the word lines.

12 Claims, 8 Drawing Sheets

U.S. PATENT DOCUMENTS

| | | | |
|---|---|---|---|
| 5,481,490 A | 1/1996 | Watanabe et al. | 365/145 |
| 5,491,102 A | 2/1996 | Desu et al. | 438/3 |
| 5,506,436 A | 4/1996 | Hayashi et al. | 257/351 |
| 5,554,559 A | 9/1996 | Wolters et al. | 437/62 |
| 5,578,867 A | 11/1996 | Argos, Jr. et al. | 257/632 |
| 5,580,814 A | 12/1996 | Larson | 437/52 |
| 5,670,808 A | 9/1997 | Nishihori et al. | 257/310 |
| 5,689,126 A | 11/1997 | Takaishi | 257/306 |
| 5,716,875 A | 2/1998 | Jones, Jr. et al. | 438/3 |
| 5,719,416 A | 2/1998 | Yoshimori et al. | 257/295 |
| 5,721,700 A | 2/1998 | Katoh | 365/145 |
| 5,767,541 A * | 6/1998 | Hanagasaki | 257/295 |
| 5,801,410 A | 9/1998 | Kim | 257/295 |
| 5,945,348 A * | 8/1999 | Blalock et al. | 438/692 |
| 6,069,036 A * | 5/2000 | Kim | 438/238 |

* cited by examiner

FERROELECTRIC MEMORY DEVICES INCLUDING PATTERNED CONDUCTIVE LAYERS

CROSS-REFERENCE TO RELATED APPLICATION

This application is related to application Ser. No. 08/869,704, filed Jun. 5, 1997, entitled "Ferroelectric Memory Devices and Fabrication Methods Therefor", assigned to the assignee of the present application, the disclosure of which is hereby incorporated herein by reference.

FIELD OF THE INVENTION

This invention relates to integrated circuit devices and fabrication methods therefor, and more particularly to integrated circuit memory devices and fabrication methods therefor.

BACKGROUND OF THE INVENTION

Ferroelectric thin films have been used in nonvolatile memory devices to form ferroelectric memory devices. Ferroelectric memory devices utilize the spontaneous polarization phenomenon of a ferroelectric material to store information. High speed read/write operations may be accomplished with ferroelectric memory devices compared to conventional Erasable and Programmable Read Only Memories (EPROM) or Electrically Erasable and Programmable Read Only Memories (EEPROM).

Moreover, if a ferroelectric thin film is used as a dielectric layer in a cell capacitor of a Dynamic Random Access Memory (DRAM), a refresh operation may not be required, which can thereby reduce the power consumption of the DRAM and can improve the speed thereof. A ferroelectric memory device can perform read and write operations using a single power supply voltage similar to a Random Access Memory (RAM). Accordingly, ferroelectric memory devices are also referred to as Ferroelectric RAM (FRAM) devices.

FRAM devices may be classified into two categories based on the unit cells thereof. The first category includes devices having unit cells including a transistor in which the ferroelectric film is used as a gate insulating layer. The second category includes unit cells having an access transistor and a capacitor in which the ferroelectric film is used for the dielectric layer of the capacitor.

A FRAM in the first category, including a ferroelectric film as a gate insulating layer in a transistor, may have operational problems. For example, a silicon dioxide layer may be generated at the interface between a silicon substrate and the ferroelectric film which functions as a gate insulator due to a reaction between the silicon substrate and oxygen atoms. Moreover, it may be difficult to obtain high quality ferroelectric films due to the lattice constant difference or thermal expansion coefficient difference between the silicon substrate and the ferroelectric film.

For at least these reasons, FRAM devices of the second category have also been developed, in which the ferroelectric film is used as the dielectric layer of a cell capacitor. These devices may generally have a similar structure to a cell structure of a DRAM.

Figure 1:
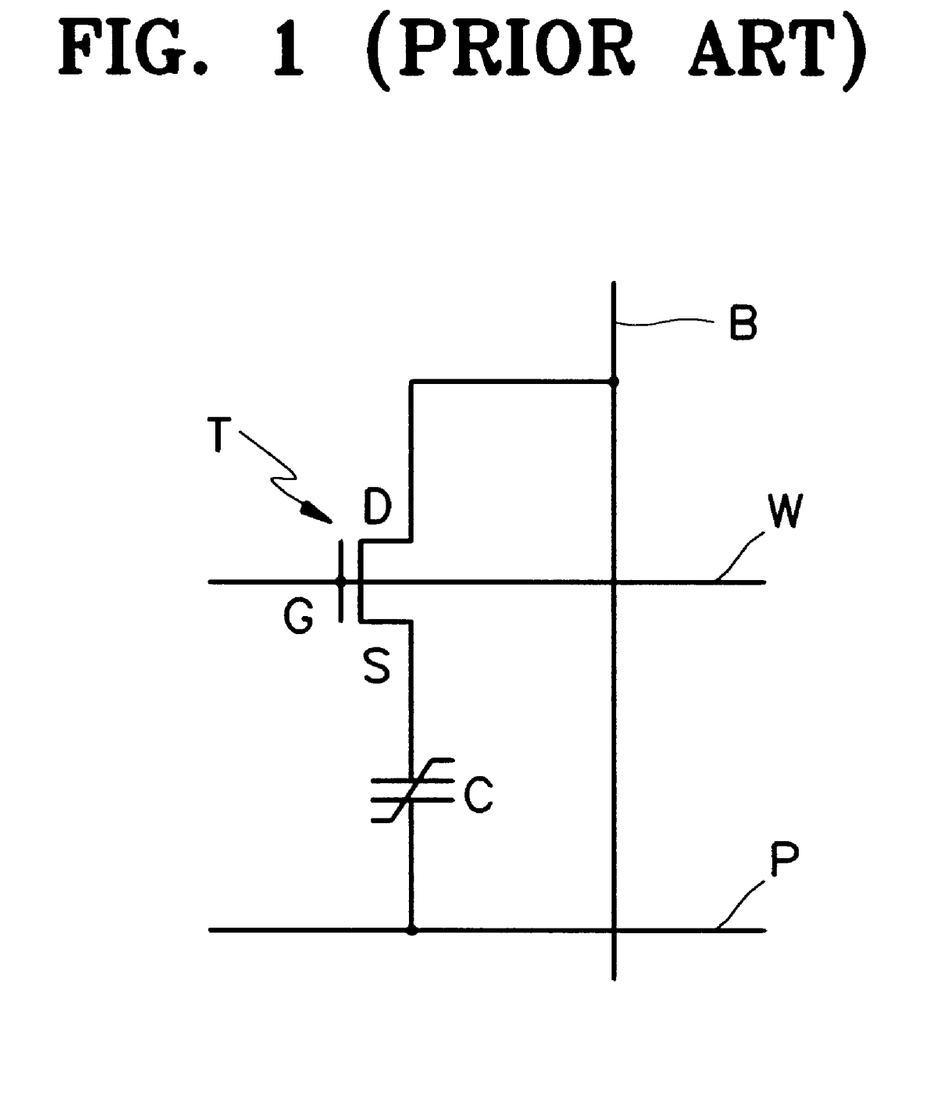
FIG. 1 is an equivalent circuit diagram of a unit cell of a conventional ferroelectric memory device.

FIG. 1 is an equivalent circuit diagram of a conventional unit cell of a FRAM in which the ferroelectric film is used as the dielectric layer of the cell capacitor. In the circuit configuration shown in FIG. 1, the gate electrode G of an NMOS transistor T is connected to a word line W. The drain region D is connected to a bit line B, and the source region S is connected to one electrode of a ferroelectric capacitor C. The other electrode of the ferroelectric capacitor C is connected to a plate line P.

In conventional FRAM cells as described above, multiple masking steps and multiple conductive layers are generally used during fabrication. The use of multiple masking steps and multiple conductive layers may make it difficult to maintain alignment between layers and masking steps, and may thereby limit the integration density, cost and/or reliability of integrated circuit ferroelectric devices. Accordingly, there continues to be a need for integrated circuit ferroelectric memory device manufacturing methods and structures that can reduce the number of masking steps and/or conductive layers.

SUMMARY OF THE INVENTION

It is therefore an object of the present invention to provide integrated circuit ferroelectric memory manufacturing methods and structures that can reduce the number of masking steps.

It is another object of the present invention to provide integrated circuit ferroelectric memory manufacturing methods and structures that can reduce the number of separate conductive layers that need be used.

These and other objects are provided, according to the present invention, by methods of manufacturing integrated circuit ferroelectric memory devices wherein a first patterned conductive layer is formed on an integrated circuit substrate, to define a lower capacitor electrode and a gate electrode that is spaced apart therefrom. A source region and a drain region are formed on opposite sides of the gate electrode. A ferroelectric layer is formed on the lower capacitor electrode. An upper capacitor electrode is formed on the ferroelectric layer opposite the lower capacitor electrode, to thereby form a ferroelectric capacitor. Accordingly, the first patterned conductive layer is used to define both the lower capacitor electrodes and the gate electrodes for the integrated circuit ferroelectric memory device. It will be understood that the step of forming a source region and a drain region may precede the step of forming a first patterned conductive layer, such that the gate electrode is formed between the source region and the drain region.

The lower capacitor electrode preferably includes a lower capacitor electrode sidewall, and the gate electrode preferably includes a gate electrode sidewall. Between the steps of forming a first patterned conductive layer and forming a source region and a drain region, a lower capacitor electrode sidewall spacer and a gate electrode sidewall spacer are preferably formed on the lower capacitor electrode sidewall and on the gate electrode sidewall respectively. Between the steps of forming a ferroelectric layer and forming an upper capacitor electrode, an interlayer dielectric layer is preferably formed on the gate electrode, that exposes the lower electrode.

The first patterned conductive layer may be formed by forming an insulating layer on the integrated circuit substrate, forming a conductive layer on the insulating layer and patterning the conductive layer and the insulating layer, to form the first patterned conductive layer. Moreover, the conductive layer itself may be formed by forming a first conductive sublayer on the insulating layer and forming a second conductive sublayer on the first conductive sublayer. The second conductive sublayer, the first conductive sublayer and the insulating layer are then sequentially patterned, preferably using a single mask.

In another embodiment, the first patterned conductive layer defines a lower capacitor electrode and a pair of gate electrodes that are spaced apart from one another. A drain region is formed between the spaced apart gate electrodes and a pair of source regions is formed outside the gate electrodes on opposite sides thereof.

In forming a ferroelectric layer, the ferroelectric layer may be formed on the interlayer dielectric layer and on the exposed lower electrode, and then removed from the interlayer dielectric layer so that the ferroelectric layer only remains on the exposed lower electrode. The ferroelectric layer may be removed by chemical-mechanical polishing.

According to another aspect of the invention, the interlayer dielectric layer includes a sidewall on the lower electrode. Prior to forming the ferroelectric layer, a sidewall spacer is formed on the dielectric layer sidewall, to reduce diffusion from the ferroelectric layer. Moreover, a capping layer may be formed on the upper electrode to reduce diffusion from the ferroelectric layer through the upper electrode.

After forming the upper capacitor electrode, an interconnect layer is formed that electrically connects the top electrode and the source region. A bit line is formed that electrically contacts the drain region. Preferably, both the interconnect layer and the bit line are formed from the same conductive layer. More specifically, a second patterned conductive layer is formed on the source and drain regions and on the top electrode, to define an interconnect layer that electrically connects the top electrode and the source region and a bit line that electrically contacts the drain region. Thus, separate conductive layers need not be used for the top level interconnections. Prior to forming the second patterned conductive layer, a second interlayer dielectric layer may be formed on the source and drain regions and on the upper electrode, the second interlayer dielectric layer exposing a portion of the source region, the drain region and the upper electrode.

It will be understood that the steps of forming a first patterned conductive layer to define a lower capacitor electrode and a gate electrode, and forming a second patterned conductive layer to define an interconnect layer and a bit line, may be used together or may be used separately.

According to yet another aspect of the present invention, the ferroelectric layer and the upper capacitor layer may also be patterned using a single mask. More specifically, an unpatterned ferroelectric layer is formed on the lower capacitor electrode, on the gate electrode and on the source and drain regions. An unpatterned upper capacitor electrode layer is formed on the ferroelectric layer. The unpatterned upper capacitor layer and the unpatterned ferroelectric layer are then patterned, to thereby form a patterned ferroelectric and a patterned upper electrode of a ferroelectric capacitor.

Integrated circuit ferroelectric memory devices according to the invention comprise an integrated circuit substrate including an elongated active region therein, and a pair of spaced apart word lines that cross the elongated active region. A drain region is provided in the elongated active region between the pair of word lines. A pair of source regions is provided in the elongated active region, a respective one of which is outside the pair of spaced apart word lines on opposite sides of the drain region. A pair of ferroelectric capacitors are provided outside the elongated active region. A respective one of the ferroelectric capacitors is adjacent a respective one of the pair of source regions.

Each of the ferroelectric capacitors includes a lower electrode on the integrated circuit substrate, extending along the integrated circuit substrate parallel to the word lines to define a plate line. A ferroelectric layer is provided on the lower electrode opposite the integrated circuit substrate. An upper electrode is provided on the ferroelectric layer opposite the lower electrode.

Integrated circuit ferroelectric devices according to the invention also include an interconnect layer that electrically connects a respective one of the upper electrodes to a respective one of the source regions and a bit line, electrically connected to the drain region and extending along the integrated circuit substrate orthogonal to the word lines. In preferred embodiments of the invention, a first conductive layer is included, and the pair of spaced apart word lines and the lower electrodes comprise first and second portions respectively of the first conductive layer. The first conductive layer more preferably comprises a first sublayer including doped polysilicon and a second sublayer on the first sublayer. The second sublayer preferably comprises at least one of platinum, iridium, ruthenium, tungsten iridium oxide, rhenium oxide and ruthenium oxide.

A second conductive layer is also preferably provided. The interconnect layer and the bit line preferably comprise first and second portions respectively of the second conductive layer. The second conductive layer preferably comprises at least one of doped polysilicon tungsten and aluminum.

A sidewall spacer may be provided on the ferroelectric layer sidewall that reduces diffusion from the ferroelectric layer. The sidewall spacer preferably comprises aluminum oxide. A capping layer is also preferably provided on the upper electrode opposite the ferroelectric layer, to reduce diffusion from the ferroelectric layer through the upper electrode. The capping layer preferably comprises titanium oxide. The ferroelectric layer preferably comprises at least one of PZT, PLZT and Y, and the upper electrode preferably comprises the same material as the second sublayer. Accordingly, integrated circuit ferroelectric memory device fabrication methods and structures are provided that can use fewer conductive layers and/or masking steps to allow high density, improved reliability and/or reduced costs.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
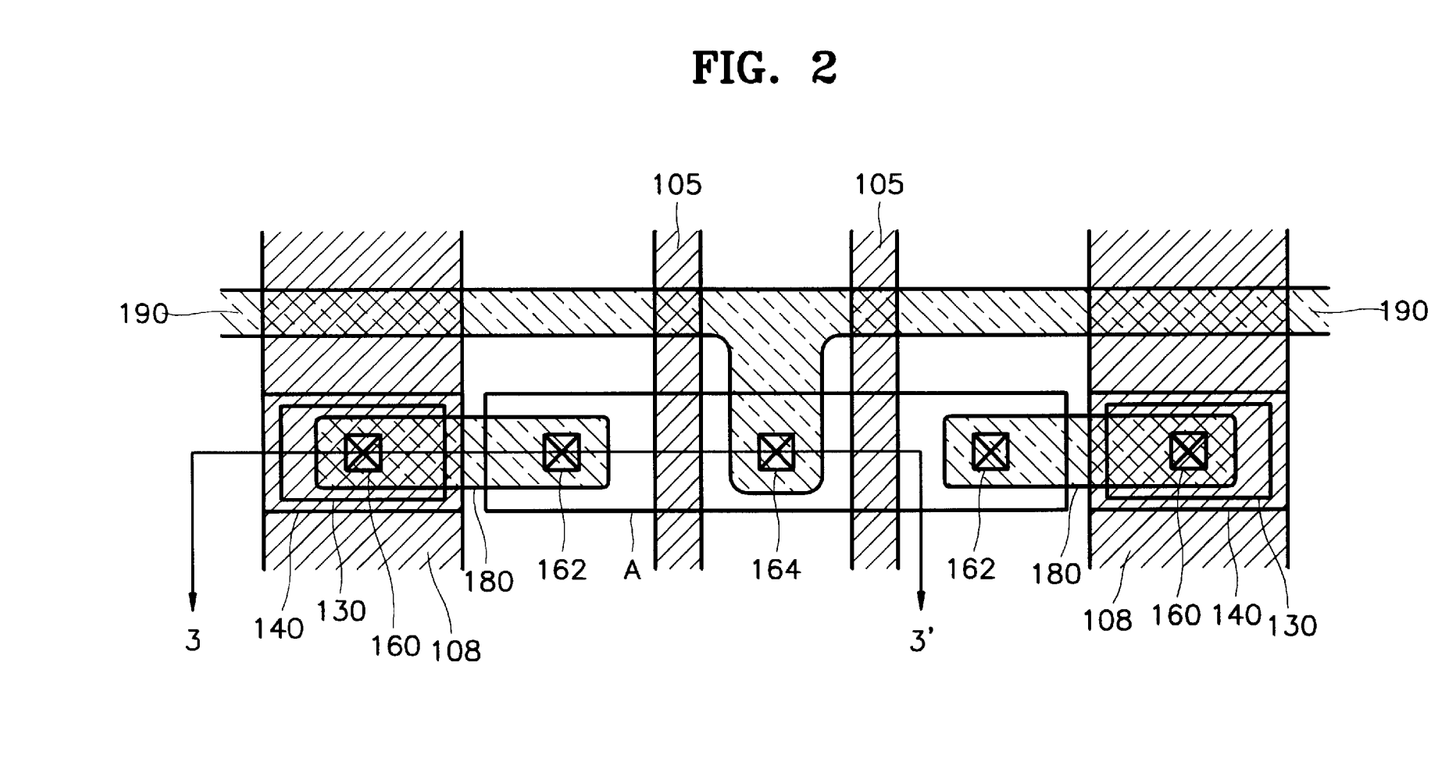
FIG. 2 is a layout of a pair of cells of a cell array region of integrated circuit ferroelectric memory devices according to the present invention.

In a cell array region of integrated circuit ferroelectric memory devices according to the present invention, also referred to as a FRAM, a pair of cells shown in FIG. 2 are repeatedly arranged in a matrix in an integrated circuit substrate.

Referring to FIG. 2, paired cells of a FRAM according to the present invention include an elongated active region A which is defined by forming an isolation film as an inactive region in a predetermined region of an integrated circuit substrate such as a P-type semiconductor substrate. A pair of spaced apart word lines 105 extend parallel to each other, crossing the active region A. A drain region is provided in the active region between the pair of word lines 105. A pair of source regions are provided in the active region outside the word lines and on opposite sides of the drain region. The word lines 105 act as gate electrodes, and the drain and source regions are doped with N-type dopants.

Paired cells of a ferroelectric memory device according to the present invention include a pair of lower electrodes 108 in the inactive regions adjacent the source regions, extending in a direction perpendicular to the active region A, i.e., parallel to the word lines 105. A ferroelectric layer 130 is provided on each lower electrode 118. A pair of upper electrodes 140 are provided on the ferroelectric layer 130.

An interconnection layer 180 connects the upper electrodes 140 and the source regions of the active region A via first interconnection contacts 160 in predetermined regions of the upper electrodes 140, and second interconnection contacts 162 in predetermined regions of the source regions. The lower electrodes 108 extend along the integrated circuit substrate parallel to the word lines 105 to define plate lines.

Also, paired cells of ferroelectric memory devices according to the present invention include a bit contact 164 formed in a predetermined region of the drain region. A bit line 190 extends orthogonal to the word lines 105, contacting the bit contact 164.

FIGS. 3 through 12 are cross-sectional views illustrating methods for fabricating one cell of a FRAM shown in FIG. 2, according to the present invention.

Figure 3:
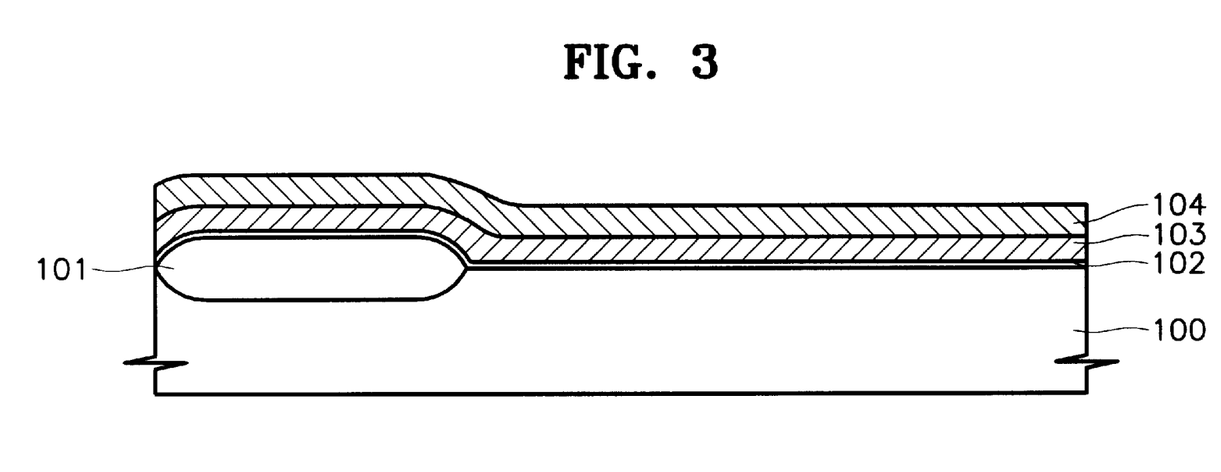
FIGS. 3 through 12 are cross-sectional views illustrating methods for fabricating integrated circuit ferroelectric memory devices according to the present invention.

Referring now to FIG. 3, a gate insulation layer 102 is formed on a P-type semiconductor substrate 100 in which an active region and an inactive region are defined by an isolation layer 101. A first conductive sublayer 103 and a second conductive sublayer 104 are sequentially formed to form an electrode layer. The first conductive layer 103 may comprise a polysilicon layer doped with impurities, and the second conductive layer 104 may comprise at least one of platinum (Pt), iridium (Ir), ruthenium (Ru), tungsten (W), iridium oxide ($Ir_2O_3$), rhenium oxide ($ReO_2$) and ruthenium oxide ($RuO_2$).

Figure 4:
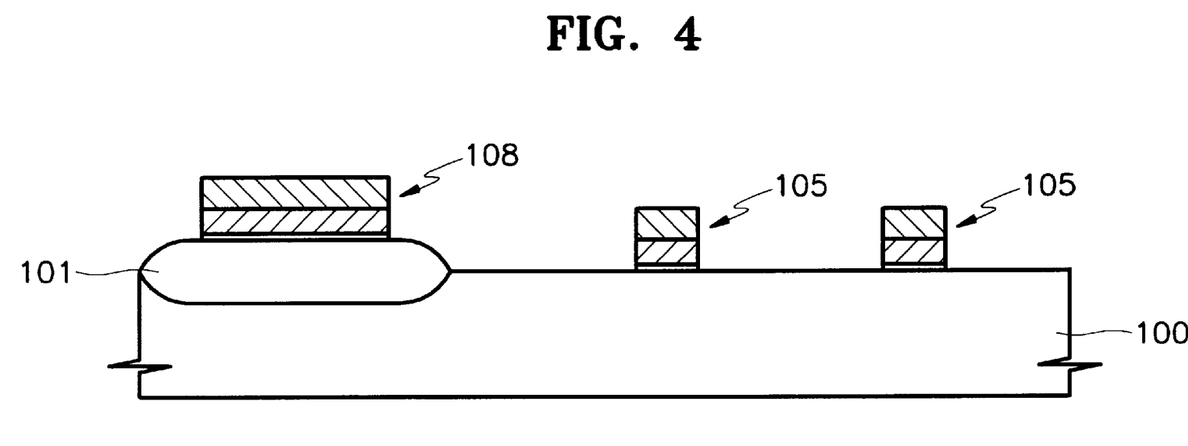

Referring to FIG. 4, the electrode layer comprised of the first and second conductive sublayers 103 and 104, and the gate insulation film 102 are patterned to form a gate electrode 105 in the active region of the semiconductor substrate 100, and a lower capacitor electrode 108 in the inactive region, which extends parallel to the gate electrode 105. The lower electrode 108 also forms a plate line.

Figure 5:
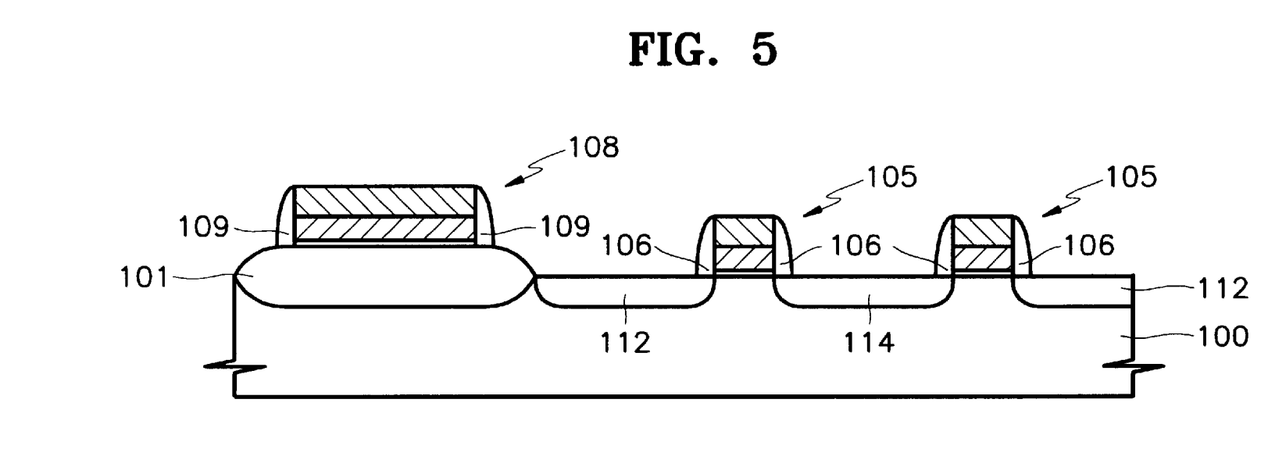

Referring to FIG. 5, insulating sidewall spacers 106 and 109 formed of nitride for example, are formed on the sidewalls of the gate electrode 105 and the lower electrode 108, respectively. An N-type source region 112 and a drain region 114 are formed on opposite sides of the gate electrode 105, thereby forming a transistor on the semiconductor substrate 100. It will be understood that the gate electrode 105 may also be formed after the source and drain regions 112 and 114.

Figure 6:
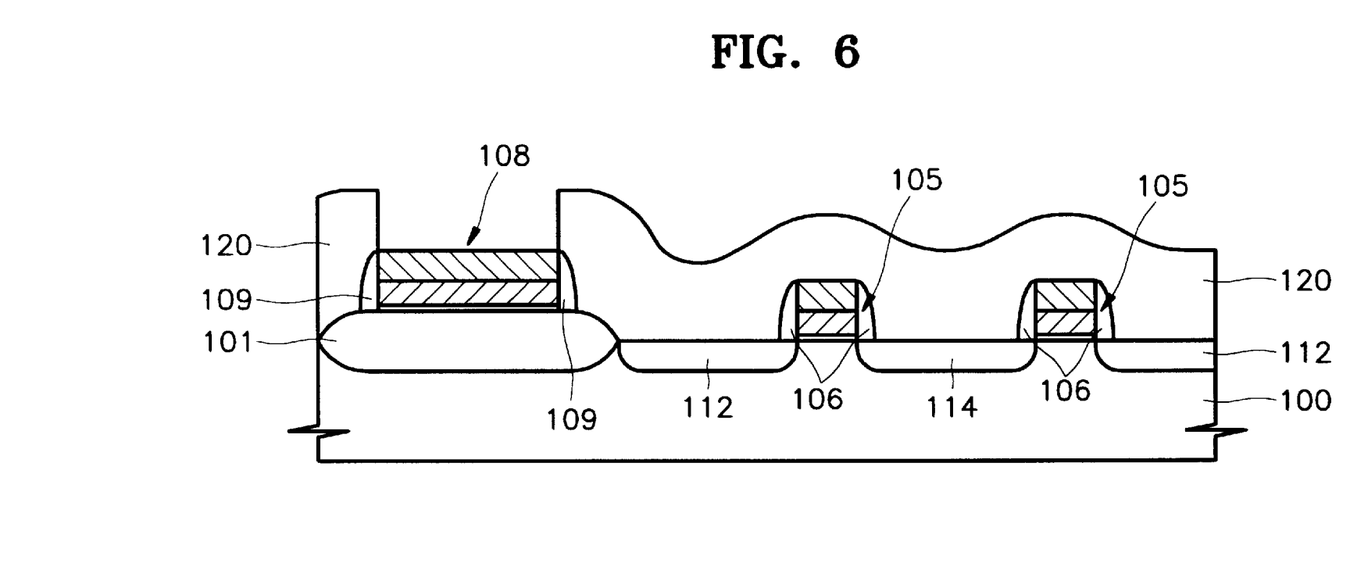

Referring to FIG. 6, an insulating layer formed of borophosphosilicate glass (BPSG) for example, is formed on the transistor and the lower electrode 108. The insulating layer is patterned such that an opening exposing only the upper surface of the lower electrode 108 is formed, thereby forming a first interlayer dielectric (ILD) layer 120.

Figure 7:
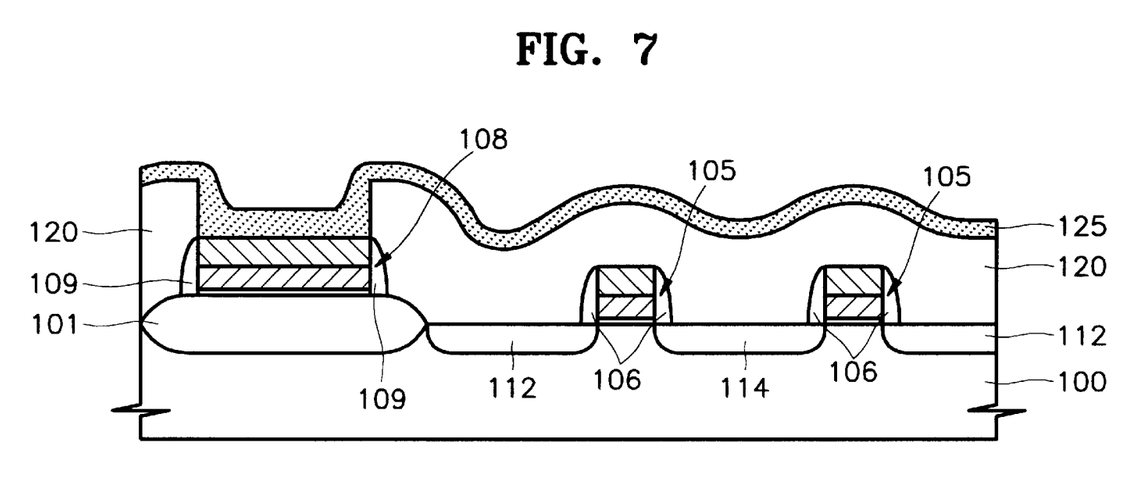

Referring to FIG. 7, an insulation layer 125 for reducing and preferably preventing diffusion is formed on the first ILD layer 120. The insulation layer 125 forms a barrier layer capable of reducing or preventing diffusion between a ferroelectric material forming the first ILD layer 120. Here, the insulation layer 125 may be formed of a material such as aluminum oxide ($Al_2O_3$) or titanium oxide ($TiO_2$).

Figure 8:
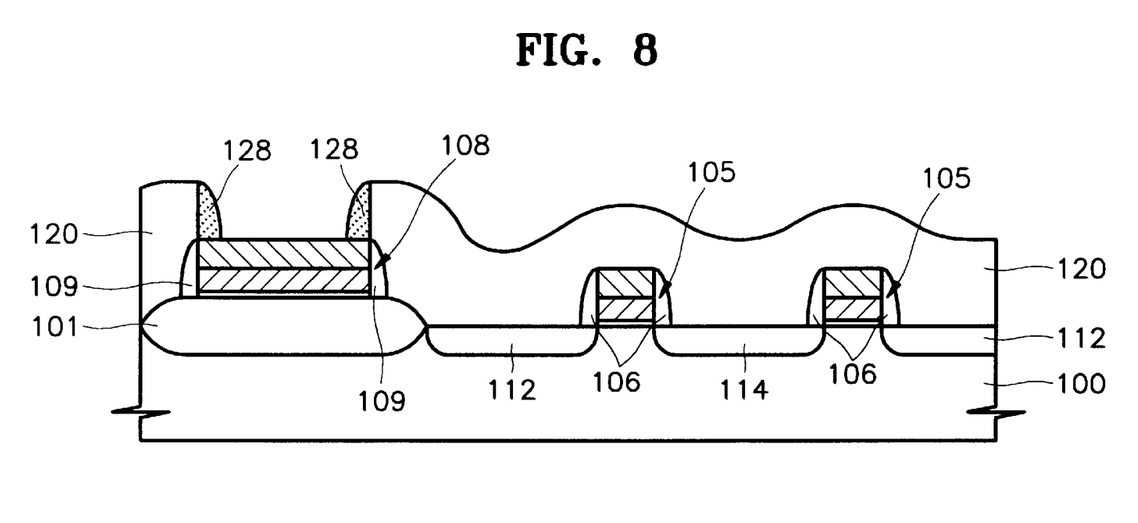

Referring to FIG. 8, the insulation layer 125 is etched by reactive ion etching (RIE), thereby exposing the upper surface of the lower electrode 108 and simultaneously forming a barrier layer 128 having a sidewall spacer shape on the sidewall of the first ILD layer 120. The step of forming the barrier layer 128, illustrated with reference to FIGS. 7 and 8 is optional and may be omitted.

Figure 9:
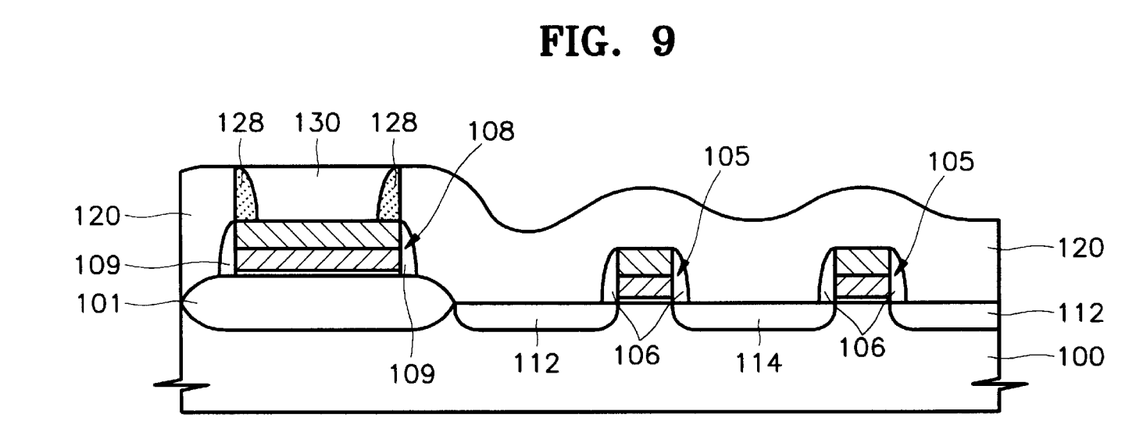

Referring to FIG. 9, a ferroelectric layer 130 is formed by filling ferroelectric material in the opening. In detail, a blanket (unpatterned) ferroelectric layer is formed using ferroelectric material such as PZT ($PbZr_xTi_{1-x}O_3$), PLZT (PZT doped with lanthanum (La)) and Yi, by a sol-gel process, sputtering method or chemical vapor deposition (CVD) method. Other materials and methods may be used. Then, the blanket ferroelectric film is selectively removed by an etch back method or chemical mechanical polishing (CMP) method, preferably until its height becomes equal to that of the upper surface of the first ILD layer 120, thereby forming the ferroelectric layer 130 filling the opening.

Figure 10:
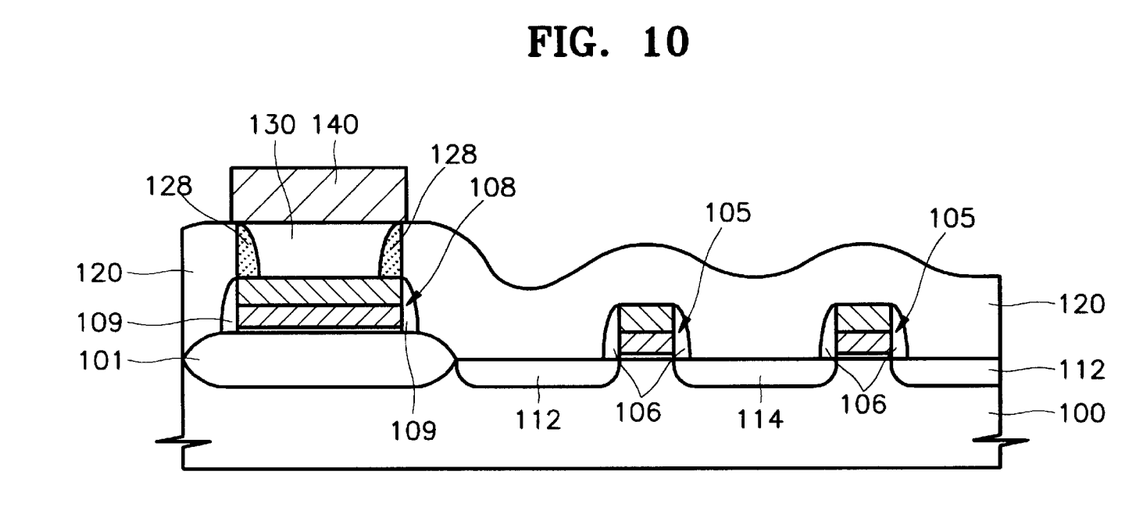

Referring to FIG. 10, an upper electrode 140 is formed on the ferroelectric layer 130. In order to form the upper electrode 140, a blanket conductive layer is formed. The blanket conductive layer preferably comprises at least one of Pt, Ir, Ru, W, $Ir_2O_3$, $ReO_2$ and $RuO_2$. Then, the blanket conductive layer is patterned to remain only on the ferroelectric layer 130.

In the embodiment illustrated with reference to FIGS. 9 and 10, the ferroelectric layer 130 and the upper electrode 140 are separately formed. However, the present invention is not limited to this embodiment. According to another method for forming the ferroelectric layer 130 and the upper electrode 140, a ferroelectric material such as PZT, PLZT or Yi, is blanket coated by a sol-gel method. Then, a blanket conductive layer is formed on the blanket ferroelectric film, using at least one of Pt, Ir, Ru, W, $Ir_2O_3$, $ReO_2$ and $RuO_2$. Then, the conductive layer for the upper electrode and the ferroelectric layer are patterned in one etching step to form the ferroelectric layer 130 and the upper electrode 140 which are stacked in sequence on the lower electrode 108. As a result, a ferroelectric capacitor including the lower electrode 108, the ferroelectric layer 130 and the upper electrode 140 is completed.

Figure 11:
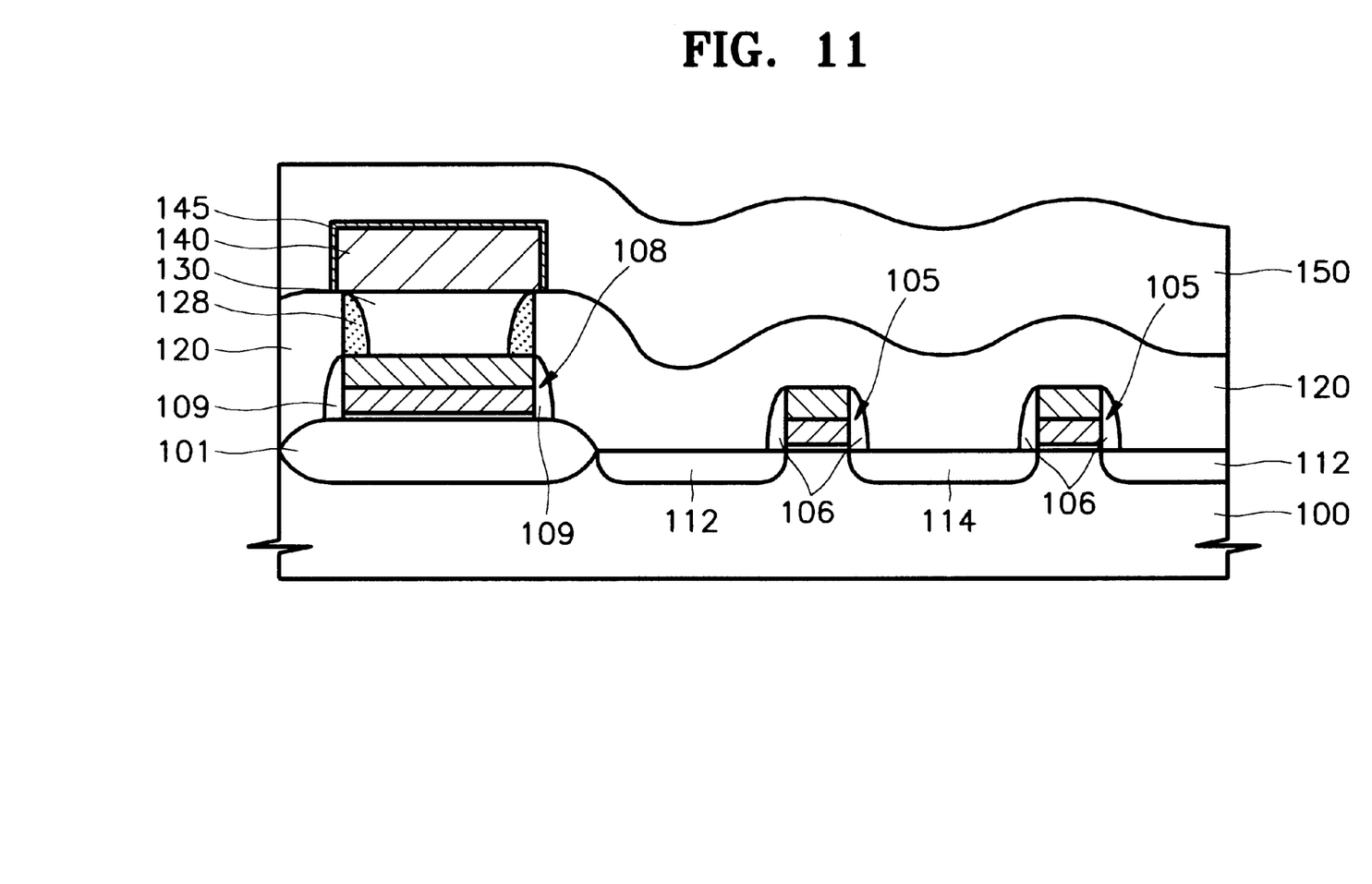

Referring to FIG. 11, a capping layer 145 covering the upper electrode 140 is formed. The capping layer 145 reduces and preferably prevents diffusion from the ferroelectric film 130 via the upper electrode 140. The capping layer 145 may comprise $TiO_2$ or $Al_2O_3$. Then, a second ILD layer 150 comprising oxide is formed, for example by CVD.

Figure 12:
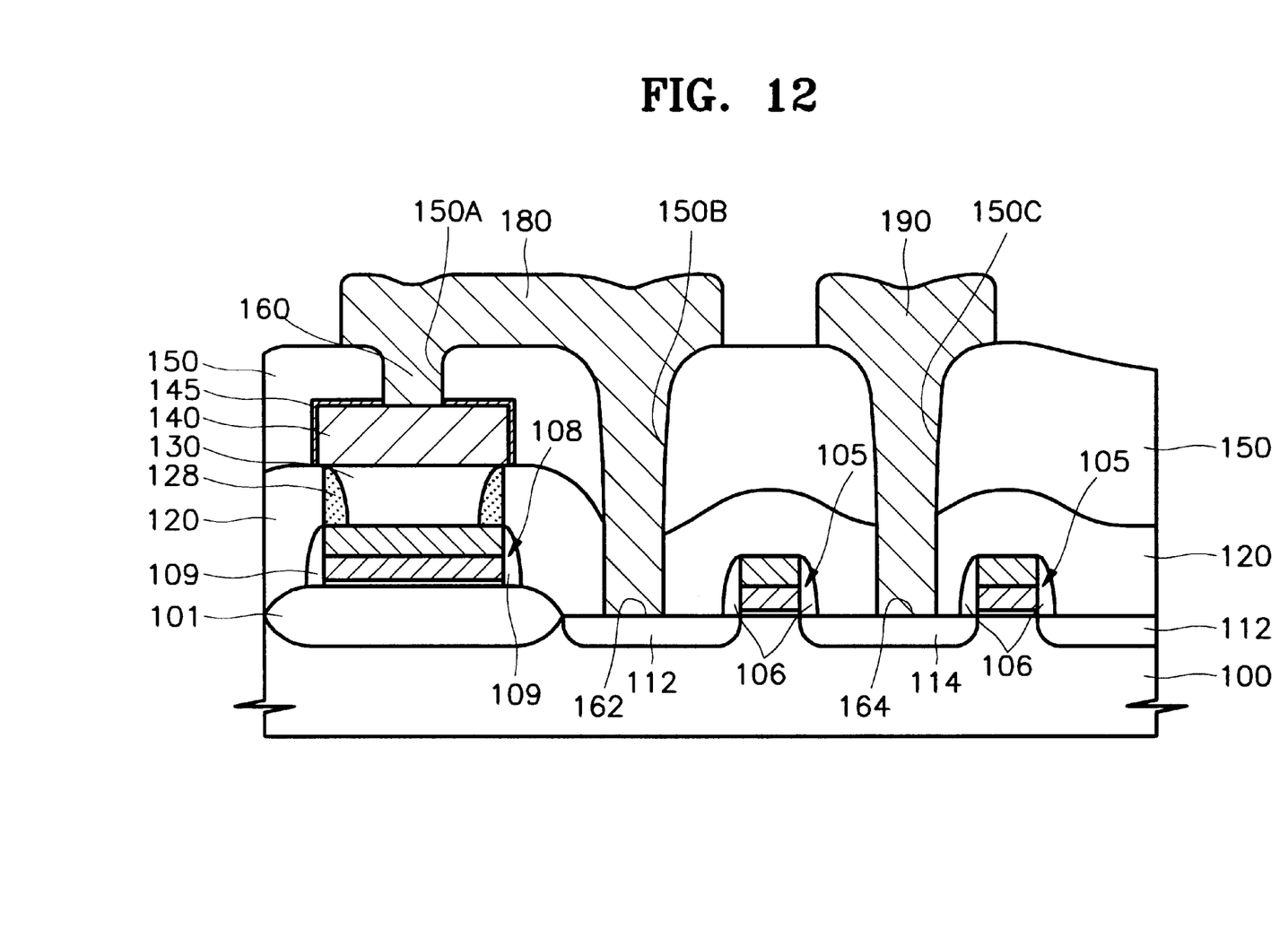

Referring to FIG. 12, the second ILD layer 150, the first ILD layer 120 and the capping layer 145 are etched by a dry etching method using plasma, to form a first interconnection contact hole 150A partially exposing the upper surface of the upper electrode 140 of the ferroelectric capacitor, a second interconnection contact hole 150B partially exposing the source region 112, and a bit contact hole 150C partially exposing the drain region 114.

Still referring to FIG. 12, the unpatterned layer of impurity-doped polysilicon, tungsten or metal such as aluminum is deposited, and then patterned to form an interconnection layer 180 for electrically connecting the upper electrode 140 and the source region 112 via the first interconnection contact 160 of the first interconnection contact hole 150A and the second interconnection contact 162 of the second interconnection contact hole 150B. Simultaneously, a bit line 190 which is connected to the drain region 114 via the bit contact 164 in the bit contact hole 150C is formed. The bit line 190 extends perpendicular to the gate electrode 105.

Accordingly, the lower electrode of the ferroelectric capacitor can be directly used as a plate line. Thus, extra steps of forming a contact hole connecting the electrode of the capacitor and the plate line, and of forming a metal interconnection layer for forming the plate line, may be eliminated. Also, the gate electrode and the lower electrode of the ferroelectric capacitor can be formed at the same time, and the interconnection layer connecting the upper electrode of the ferroelectric capacitor with the source region of the semiconductor substrate and the bit line can be formed simultaneously, thereby allowing a simplified manufacturing process.

Also, since the source region of the semiconductor substrate and the upper electrode of the ferroelectric capacitor may be connected via the interconnection layer, much of the area occupied by the lower electrode can be used as an effective area of the ferroelectric capacitor. Thus, the effective area of the capacitor may be increased compared to where the source region is connected to the lower electrode. Denser integration in the cell may therefore be provided.

Finally, the ferroelectric film of the ferroelectric capacitor may be formed by filling the opening in the ILD layer with ferroelectric material. Thus, damage to the sidewall of the ferroelectric layer caused during etching, can be reduced and preferably prevented. This contrasts with conventional methods where a dry etching method is used to form the ferroelectric film.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit ferroelectric memory device comprising:
    an integrated circuit substrate including an elongated active region therein;
    a pair of spaced apart word lines that cross the elongated active region;
    a drain region in the elongated active region between the pair of word lines;
    a pair of source regions in the elongated active region, a respective one of which is outside the pair of spaced apart word lines on opposite sides of the drain region;
    a pair of ferroelectric capacitors outside the elongated active region, a respective one of which is adjacent a respective one of the pair of source regions, each of the ferroelectric capacitors comprising:
        a lower electrode on the integrated circuit substrate and extending along the integrated circuit substrate parallel to the word lines to define a plate line;
        a ferroelectric layer on the lower electrode opposite the integrated circuit substrate;
        an upper electrode on the ferroelectric layer opposite the lower electrode; and
        a capping layer disposed exclusively on the upper electrode opposite the ferroelectric layer and sidewalls of the upper electrode that reduces diffusion from the ferroelectric layer through the upper electrode;
    a first conductive layer, the pair of spaced apart word lines and the lower electrodes comprising first and second portions of the first conductive layer, respectively;
    an interconnect layer that electrically connects a respective one of the upper electrodes to a respective one of the source regions; and
    a bit line, electrically connected to the drain region and extending along the integrated circuit substrate orthogonal to the word lines.

2. An integrated circuit ferroelectric memory device according to claim 1 wherein the first conductive layer comprises a first sublayer comprising doped polysilicon and a second sublayer on the first sublayer, the second sublayer comprising at least one material selected from the group consisting of platinum, iridium, ruthenium, tungsten, iridium oxide, rhenium oxide, and ruthenium oxide.

3. An integrated circuit ferroelectric memory device according to claim 1 wherein the ferroelectric layer includes a sidewall, the integrated circuit memory device further comprising a sidewall spacer on the sidewall.

4. An integrated circuit ferroelectric memory device according to claim 3 wherein the sidewall spacer comprises aluminum oxide.

5. An integrated circuit ferroelectric memory device according to claim 1 wherein the ferroelectric layer comprises at least one material selected from the group consisting of PZT, PLZT and Yy.

6. An integrated circuit ferroelectric memory device according to claim 2 wherein the upper electrode comprises same material as the second sublayer.

7. An integrated circuit ferroelectric memory device according to claim 1 further comprising a second conductive layer, and wherein the interconnect layer and the bit line comprise first and second portions, respectively, of the second conductive layer.

8. An integrated circuit ferroelectric memory device according to claim 7 wherein the second conductive layer comprises at least one material selected from the group consisting of doped polysilicon, tungsten and aluminum.

9. An integrated circuit ferroelectric memory device according to claim 1 wherein the capping layer comprises titanium oxide.

10. An integrated circuit ferroelectric memory device according to claim 1 further comprising an interlayer dielectric (ILD) layer disposed on the pair of spaced apart word lines, the interlayer dielectric layer having an opening therein such that the ferroelectric layer is disposed in the opening.

11. An integrated circuit ferroelectric memory device according to claim 10 wherein the ferroelectric layer includes a sidewall and the opening in the interlayer dielectric layer defines a sidewall, the integrated circuit ferroelectric memory device further comprising a sidewall spacer interposed between the ferroelectric layer sidewall and the interlayer dielectric layer sidewall.

12. An integrated circuit ferroelectric memory device according to claim 1 wherein the capping layer comprises a material selected from the group consisting of $TiO_2$ and $Al_2O_3$.

* * * * *

UNITED STATES PATENT AND TRADEMARK OFFICE
CERTIFICATE OF CORRECTION

PATENT NO. : 6,359,295 B2
DATED : March 19, 2002
INVENTOR(S) : Lee et al.

It is certified that error appears in the above-identified patent and that said Letters Patent is hereby corrected as shown below:

Column 6,
Line 28, please change "$Y_i$" to -- Y --.
Line 48, please change "$Y_i$" to -- Y --.

Column 8,
Line 35, please change "$Y_y$" to -- Y --.

Signed and Sealed this

Twenty-seventh Day of September, 2005

JON W. DUDAS
*Director of the United States Patent and Trademark Office*